(12) United States Patent
Bower

(10) Patent No.: US 6,346,458 B1
(45) Date of Patent: Feb. 12, 2002

(54) TRANSPOSED SPLIT OF ION CUT MATERIALS

(76) Inventor: Robert W. Bower, 825 La Playa #230, San Francisco, CA (US) 94121

(*) Notice: Subject to any disclaimer, the term of this patent is extended or adjusted under 35 U.S.C. 154(b) by 0 days.

(21) Appl. No.: 09/476,456

(22) Filed: Dec. 30, 1999

Related U.S. Application Data

(60) Provisional application No. 60/114,494, filed on Dec. 31, 1998.

(51) Int. Cl.[7] .................... H01L 21/301; H01L 21/302
(52) U.S. Cl. ........................................................ 438/458
(58) Field of Search ............................... 438/460, 464, 438/455, 456, 457, 458, 459, 514, 527, 528, 529, 530

(56) References Cited

U.S. PATENT DOCUMENTS

| | | | |
|---|---|---|---|
| 5,374,564 A | | 12/1994 | Bruel |
| 5,494,835 A | * | 2/1996 | Bruel |
| 6,150,239 A | * | 11/2000 | Goesele et al. |

OTHER PUBLICATIONS

Lu, S.; Iyer, S.S.K.; Min, J.; Fan, Z.; Liu, J.B.; Chu, P.K. Hu, C.; and Chueng, N.W.; "SOI Material Technology Using Plasma Immersion Ion Implantation," Proceedings 1996 IEEE International SOI Conference, pp. 48–49, Oct., 1996.

Marwick, A.D.; Oehrlein, G.S.; Wittmer, M.; "High Hydrogen Concentrations Produced by Segregation into P+ Layers in Silicon," Applied Physics Letters, vol. 59, No. 2, pp. 198–200, Jul. 8, 1991.

Bower, Robert W.; LeBoeuf, L.; and Li, Y.A.; "Transposed Splitting of Silicon Implanted Hydrogen and Boron with Offset Distributions," ECE Department, University of California, Davis, CA 95616, pp. 1–3, Il Nuovo Cimento, vol. 19D, No. 12, pp. 1871–1873, Jan. 1, 1998.

Bower, Robert W.; Li, Y.; and Chin, Yong J.; "The Hydrogen Ion Cut Technology Combined with Low Temperature Direct Bonding," ECE Department, University of California, Davis, CA 95616, pp. 1–3, Proceedings of SPIE, vol. 3184, pp. 2–4, Jun., 1997.

Van Wieringen, A.; Warmoltz, N.; "On the Permeation of Hydrogen and Helium Single Crystal Silicon and Germanium at Elevated Temperatures," Physica XXII, pp. 849–865, (1956).

Cerofolini, G.F.; Balboni, R.; Bisero, D.; Corni, F.; Frabboni, S.; Ottaviani, G.; Tonini, R.; Brusa, R.S.; Zecca, A.; Ceschini, M.; Gieble, G.; and Pavesi, L.; "Hydrogen Precipitation in Highly Oversaturated Single–Crystalline Silicon," Physica Status Solidi, vol. 150, pp. 539–585, (1995).

Bruel, M.; "Silicon on Insulator Material Technology," Electronics Letters, vol. 31, No. 14, Jul. 6, 1995.

Hara, Tohru,; Onda, Takayuki,; Kaklzaki, Y.; Oshima, S.; and Kltamura, T.;Kajiyama, K.; Yoneda, T.; Sekine, K.; and Inoue, M.; "Delaminations of Thin Layers by High Dose Hydrogen Ion Implantation in Silicon," Journal of Electrochemical Society, vol. 143, No. 8, Aug., 1996.

(List continued on next page.)

Primary Examiner—Charles Bowers
Assistant Examiner—Evan Pert
(74) Attorney, Agent, or Firm—John P. O'Banion

(57) ABSTRACT

A method for the transposed splitting of ion cut materials. Acceptor centers are formed and selectively introduced into a solid material. In addition, atoms are introduced into the solid material at a location that is offset spatially from acceptor centers. The atoms introduced into the solid material are then transported to the location of the acceptor centers where they will then condense in the region of the acceptor centers. As a result, then any expunged layer that is formed by ion splitting as result of the atoms being introduced into the solid material will follow the contour of the location of the acceptor centers, and will thus be transposed from the initial location of the atoms ;introduced into the solid material.

36 Claims, 1 Drawing Sheet

OTHER PUBLICATIONS

Freund, L.B.,; "A Lower Bound on Implant Density to Induce Wafer Splitting in Forming Compliant Substrate Structures," Applied Physics Letters, vol. 70, No. 26, Jun. 30, 1997.

Tong, Q.; Gutjahr, K.; Hopfe, S.; Gosele, U.; Lee, T.H.; "Layer Splitting Process in Hydrogen Implanted Si, Ge, SiC, and Diamond Substrates," Applied Physics Letters, vol. 70, No. 11, Mar. 17, 1997.

Marwick, A.D.; Oehrlein, G.S.; and Wittmer, M.; "High Hydrogen Concentrations Produced by Segregation into P+ Layers in Silicon," Marwick, A.D.; Oehriein, G.S.; and Wittmer, M.; Applied Physics Letters, vol. 59, No. 2, pp. 198–200, Jul. 8, 1991.

Li, Y.A.; Bower, Robert W.; "Surface Roughness of Hydrogen Ion Cut Low Temperature Bonded Thin Film Layers," Journal of Applied Physcis, vol. 39, pp. 275–276, Jan., 2000.

Tong, Q–Y.; Lee, T–H.; Huang, L–J.; Chao, Y–L.; Gesele, U.; "Low Temperature Si Layer Splittling," Proceedings 1997 IEEE International SOI Conference, pp. 126–127, Oct., 1997.

Agarwal, A.; Haynes, T.E.; Venezia, V.C.; Eaglesham, D.J.; Weldon, M.K.; Chabal, Y.J.; and Holland, O.W.; "Efficient Production of Silicon–on–Insulator Films by Co–Implantation of He+ with H+," Proceedings of 1997 IEEE International SOI Conference, pp. 45–45, Oct., 1997.

http://www.research.ibm.com/ionbeams/home.htm; "Ion Beams Interactions with Matter," The Stopping and Range of Ions in Matter, pp. 1–5, Jan., 1998.

Bower et al., "Transposed splitting of silicon implanted with spatially offset distributions of hydrogen and boron", Dec. 1997, IL Nuovo Cimento Note Brevi, vol. 19 D, N. 12, pp. 1871–1873.*

Tong et al., "Low Temperature Si Layer Splitting", Oct. 1997, Proceedings 1997 IEEE International SOI Conference, pp. 126–127.*

* cited by examiner

TRANSPOSED SPLIT OF ION CUT MATERIALS

CROSS-REFERENCE TO RELATED APPLICATIONS

This application claims priority from U.S. provisional application serial no. 60/114,494 filed on Dec. 31, 1998.

STATEMENT REGARDING FEDERALLY SPONSORED RESEARCH OR DEVELOPMENT

Not Applicable

REFERENCE TO A MICROFICHE APPENDIX

Not Applicable

INCORPORATION BY REFERENCE

The following publications, some of which are identified herein using the reference numbers set forth below, are incorporated herein by reference:
1. G. F. Cerofolini, R. Balboni, D. Bisero, F. Corni, S. Frabboni, G. Ottaviani, R. Tonini, R. S. Brusa, A. Zecca, M. Ceschini, G. Giebel, and L. Pavesi, Hydrogen Precipitation in Highly Oversaturated Single-Crystalline Silicon, Phys. Stat. Sol. (a) 150, 539 (1995).
2. M. Bruel, Silicon on Insulator Material Technology, Electron. Lett. 31, 1201 (1995).
3. M. Bruel, Process for the Production of Thin Semiconductor Material Films, U.S. Pat. No. 5,374,564 (filed Sept. 15, 1992, issued Dec. 20, 1994).
4. X. Lu, S. S. K. lyer, J. Min. Z. Fan, J. B. Liu, P. K. Chu, C. Hu, and N. W. Chueng, Proc. 1996 IEEE Int. SOI Conf. 96CH35937, 48 (1996).
5. Tohru Hara, Takayuki Onda, Yasuo Kakizaki, Sotaro Oshima, Taira Kltamura, Kenji Kajiyama, Tomoaki Yoneda, Kohei Sekine and Morio Inoue, Delaminations of Thin Layers by High Dose Hydrogen Ion Implantation in Silicon, J. Electrochem. Soc. Vol. 143, No. 8, August 1996 L166-L168.
6. L. B. Freund, A lower bound on implant density to induce wafer splitting in forming compliant substrate structures, Appl. Phys. Left. 70 (26), Jun. 30, 1997.
7. Q.-Y. Tong, K. Gutjahr, S. Hopfe, and U. Goesele and T.-H. Lee, Layer splitting process in hydrogen-implanted Si, Ge, SiC, and diamond substrates, Appl. Phys. Lett. 70, (11), Mar. 17, 1997 pp 1390–1392.
8. Rober w Bower, Yang A. Li and Yong Jian Chin, The Hydrogen Ion Cut Technology Combined With Low Temperature Direct Bonding, Proceedings of SPIE, Vol. 3184, pp 2–4, June 1997,
9. Y. Albert Li and Robert W. Bower, Surface Conditions and Morphology of Hydrogen Ion Cut Low Temperature Bonded Thin Film Layers, Submitted JJAP.
10. Q.-Y. Tong, T.-H. Lee, L.-J. Huang, Y.-L. Chao and U. Goesele, Low Temperature Si LayerSplitting, Proceedings 1977 IEEE International SOI Conference, Oct. 1997 pp 126–127.
11. Aditya Agarwal, T. E. Haynes, V. C. Venezia, D. J. Eaglesham, M. K. Weldon, Y.
12. J. Chabal, and O. W. Holland, Efficient Production of Silicon-on-Insulator Films by Co-implantation of He+with H+, Proceeding 1977 IEEE International SOI Conference, Oct. 1997 pp 44–45.
12. J. L. Zeigler and J. P. Biersack, The Stopping and Range of Ions in Solids,Trim 95, Pergamon Press (1985) ISBN-0-08-021603-X.
13. A. D. Marwick, G. S. Oehrlein, and M. Wittmer, High hydrogen concentrations produced by segregation into pt layers in silicon, Appl. Phys. Left. 59 (2), Jul. 8 1991, pp 198–200.
14. Robert W. Bower, Louis LeBoeuf and Y. Albert Li, "Transposed Splitting of Silicon Implanted with Spatially Offset Distributions of Hydrogen and Boron". II Nuovo Cimento, Vol. 19 D, N. 12, pp 1871–1873, Jan. 1, 1998.

BACKGROUND OF THE INVENTION

1. Field of the Invention

This invention pertains generally to introducing atoms into solid materials, and more particularly to forming and selectively introducing acceptor centers into a solid material and introducing atoms into the solid material wherein the location of the major concentration of the acceptor centers is offset spatially from the introduced atoms in the solid material.

2. Description of the Background Art

In recent years, it has been observed that atoms introduced into solid materials can result in a thin layer of the material being expunged from the solid material when a stiffener is attached to the solid material and a suitable stress is created to cause the layer crack and break off [1,2,3]. It has been found that the thickness of the expunged layer is very near that of the mean penetration depth of the introduced ions or the nearby damage peak created by the introduced ions, when the introduced ions are ion implanted into the solid material. It has also been observed that atoms that act as acceptor centers in semiconductor materials tend to attract and condense injected ions near the acceptor centers location in the material.

There has also been considerable interest in high dose hydrogen ion implantation into silicon. A recent review article describes a wealth of basic physical theory and experiments related to hydrogen implanted silicon [1]. Bruel first described the Smart Cut® technique that leads to silicon-on-insulator, SOI, material for use in silicon microcircuits [2,3]. Since that time a number of authors have described and have proposed theories to quantify the hydrogen bubble generation and crack phenomena that in combination with direct bonding leads to SOI formation [4,5,6]. Recent publications have described variations on Bruel's work. Tong et al. have described layer splitting with ion implanted hydrogen in Ge, SiC, GaAs and diamond [7]. Bower et al. have demonstrated that low temperature bonding may be used with hydrogen ion implantation to produce SOI with a bonding temperature of 200° C. and a split temperature of 400° C. [8,9]. Tong et al. have shown that boron and hydrogen when implanted to the same projected range allow optically observable surface blisters to be produced with heat treatments of 200° C. for approximately 100 minutes [10]. Agarwal et al. have demonstrated that the hydrogen ion dose may be reduced from $5 \times 10^{16}/cm^2$ to $1 \times 10^{16}/cm^2$ when silicon is also implanted with Helium also at a dose of $1 \times 10^{16}/cm^2$ [11].

BRIEF SUMMARY OF THE INVENTION

The present invention generally comprises the steps of forming and selectively introducing acceptor centers into a solid material and then introducing atoms into the solid material wherein the location of the major concentration of the acceptor centers is offset spatially from the introduced atoms in the solid material. When these steps are carried out so that the atoms introduced into the solid material can be transported in the material, then the introduced atoms may be diffused or drifted to the location of the acceptor centers that have been selectively placed in the material. The introduced atoms will then condense in the region of the acceptor centers. As a, then any god L expunged layer that forms as a result of the atoms being introduced into the solid material will follow the contour of the location of the acceptor centers, and will thus be transposed from the initial location of the atoms introduced into the solid material.

Therefore, this invention allows an expunged layer to be formed and transferred to a stiffener that is embedded in the material independent of the location of the introduced atoms.

An object of the invention is to expunge a layer of a solid material along a contour line defined by acceptor centers formed in the material.

Another object of the invention is to transpose the initial location of atoms introduced into the solid material to the location of the acceptor centers prior to expunging a layer of the solid material using the atoms.

Another object of the invention is to ion cut a material in a region spaced apart from the location where atoms are introduced in the material.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Figure 1:
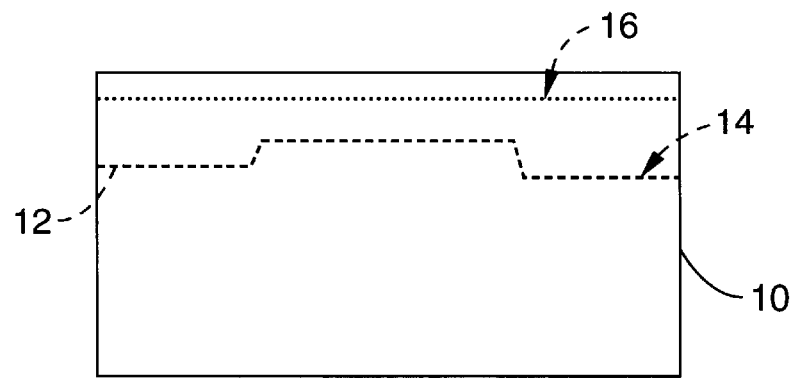
FIG. 1 schematically shows the steps of a method for forming and introducing acceptor regions in a solid material and injecting atoms into the material at a location spaced apart from the acceptor regions according to the invention.
Figure 2:
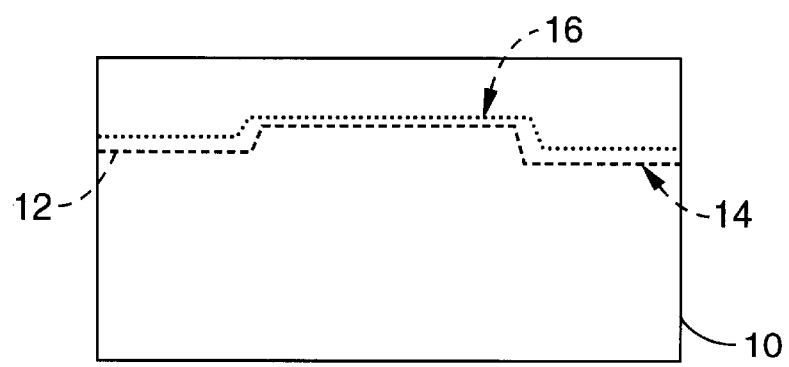
FIG. 2 schematically shows the steps of transporting the injected atoms to the location of acceptor regions shown in FIG. 1.
Figure 3:
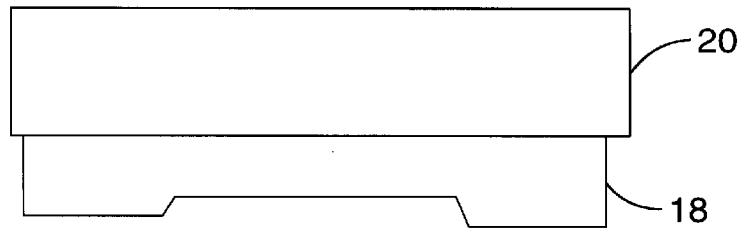
FIG. 3 schematically shows the steps of splitting the material shown along a contour line following the contour line of the acceptor regions in FIG. 2 and attaching the expunged layer to a second material.

Referring more specifically to the drawings, for illustrative purposes the present invention is embodied in the process and resulting structure generally shown in FIG. 1 through FIG. 3. It will be appreciated that the structure may vary as to configuration and as to details of the elements, and that the method may vary as to the specific steps and sequence, without departing from the basic concepts as disclosed herein.

Referring first to FIG. 1, in accordance with the present invention, a conventional getter material such as Boron is used to form and selectively introduce acceptor centers into a solid substrate material 10, such as silicon, using conventional techniques. In order to activate the acceptor sites and reduce any damage associated with their introduction, a high temperature rapid thermal anneal of over approximately 900° C. is conducted for a short period of time such as less than approximately 1 minute. The introduction of these acceptor centers 12 defines a "getter surface" 14 in the substrate material. Next, an ion implantation step is carried out. Atoms 16, such as Hydrogen atoms, are introduced into the substrate material, also using conventional techniques, such that the location of the major concentration of the acceptor centers is offset spatially by the range-energy considerations of the atoms introduced into the substrate. However, the ion implantation is carried out at a temperature high enough to prevent damage that would restrict the mobility of the Hydrogen atoms in the substrate material. A temperature greater than approximately 300° C. has been found to be sufficient in this regard.

Referring now to FIG. 2, after the foregoing steps are carried out, the atoms introduced into the substrate material can be transported through the material. Accordingly, the introduced atoms 16 may then be diffused or drifted to the location of the acceptor centers 12 that have been selectively placed in the material. Diffusion may occur automatically simply as a result of the conditions of the ion implantation. Or, the atoms can be drifted as a result of either internal or externally applied electric or other force fields.

The introduced atoms will then condense in the region of the acceptor centers. The material can then be split, thereby creating expunged layers. As a result of the previous steps, any expunged layer that is formed as a result of the atoms being introduced into the solid material will follow the contour of the location of the acceptor centers, namely getter surface 14, and will thus be transposed from the initial location of the atoms introduced into the solid material to the location of the acceptor centers.

Still another method of introducing and transporting the atoms to the acceptor centers would be to place the substrate material in an environment where Hydrogen would be adsorbed into the material and then diffused or drifted to the location of the activated getters.

Referring now to FIG. 3, the material is now ready for an expunged layer 18 to be formed. This expunging step is preferably carried out after the substrate material has been attached to a second substrate material 20 by bonding or gluing them together. It will be appreciated, however, that the expunged layer 18 could also be formed without bonding or gluing to a second material prior to expungement.

Note that, while the preferred embodiment of the method is to introduce the getter material prior to introduction of the atoms, the getter material could be introduced after introduction of the atoms as well.

EXAMPLE 1

Boron was implanted into (100) single crystal silicon at an energy of 100 KeV, at a temperature above 300° C. with a dose of $1 \times 10^{15}/cm^2$. Trim 95 predicts a mean penetration $Rp \approx 306$ nm and vertical straggling $\Delta Rp \approx 66.7$ nm for this implanted boron [12]. The sample was then rapid thermal annealed at 950° C. for 15 seconds. The sample was then implanted with $H^+$ at 40 KeV with a dose of $5 \times 10^{16}/cm^2$. In this case, Trim 95 predicts a mean penetration $Rp \approx 457$ nm and vertical straggling $\Delta Rp \approx 87.3$ nm for this implanted hydrogen [12]. The samples were then subjected to isochronal anneals for ten minutes at 100° C., 200° C., 300° C. and 350° C. Blistering occurred in the samples heated to 300° C. and 350° C. A small sliver split off the surface of the sample heated to 300° C. that allowed a measurement of the thickness of the expunged surface layer. The thickness of this expunged surface layer is found by this measurement to be 330±15 nm. This clearly indicates that the crack occurs within experimental error near the projected range, Rp, of the implanted boron acceptor centers, and far from the Rp of the considerably deeper hydrogen implantation of the introduced atoms into the solid material.

EXAMPLE 2

The experimental evidence strongly suggests that the high dose implanted hydrogen into silicon migrates and accumulates in the region of the lower dose boron distribution where it blisters and cracks the silicon near the peak of the boron profile. The blister and crack time and temperature is consistent the results found by Tong et al in their experiments with boron and hydrogen implanted to the same peak depth [10]. While the migration of the hydrogen to the boron peak is reminiscent of the work of Marwick where Ga in silicon is found to attract hydrogen implanted into silicon [13]. The Marwick paper suggests that ionized Ga$^-$ in silicon attracts H$^+$ ions and at temperatures of ~200° C. may attract quantities of H much in excess of the density of Ga present by the reaction:

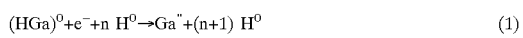

(1)

EXAMPLE 3

Ionized boron may attract and accumulate hydrogen in much the same manner in our work. Equation (1) does not explain where the accumulated hydrogen would reside, but other literature suggests that it might cluster near the Ga or B or perhaps in silicon defect structures that would be present after an implantation near these acceptor sites [1,13]. The importance of the RTA of the boron in our experiments is not known, but may be important in the light of the ionized donor argument just described, since without the RTA the boron would not be expected to be electrically active and act as an ionized acceptor.

Accordingly, it will be seen that this invention provides for the transposition of an ion cut layer in a substrate material by using a getter to form a surface within a substrate material toward which injected atoms can be migrated prior to splitting the material. It will be understood by those skilled in the art that this migration does not occur automatically, and that energy must be introduced in order to cause the migration. Additional energy is required to cause the material to expunge along the surface defined by the injected atoms in the vicinity of the getter material. Since the technology for forming the expunged layers, applying energy to the materials, avoiding damage of introduced atoms, introducing and forming acceptors, and introducing atoms are all contained in the current literature and can be practiced by one of ordinary skill in the applied materials area, such technology will not be described in detail herein.

It will be appreciated that the foregoing method described herein can have many applications and employ various materials. By way of example, and not of limitation, the atoms injected can be hydrogen atoms, the substrate can be a semiconductor such as silicon, the getter material in a silicon substrate can be a Group Ill material such as gallium or boron, the second substrate can be a semiconductor to which a silicon expunged layer could be bonded or a flexible membrane to which the expunged layer is glued, and the energy applied can be mechanical energy or heat. Although the description above contains many specificities, these should not be construed as limiting the scope of the invention but as merely providing illustrations of some of the presently preferred embodiments of this invention. Thus the scope of this invention should be determined by the appended claims and their legal equivalents.

What is claimed is:

1. A method for transposed splitting of ion cut materials, comprising the steps of:
   (a) introducing a plurality of acceptor centers into a solid material;
   (b) introducing a plurality of atoms into said material at a location spaced apart from the location of said acceptor centers;
   (c) transporting said atoms toward said acceptor centers; and
   (d) expunging a layer of said material, wherein said expunged layer has a surface with a contour defined by said acceptor centers.

2. A method as recited in claim 1, further comprising the step of attaching said expunged layer to a second solid material.

3. A method as recited in claim 1, wherein said solid material is attached to a second solid material prior to said expunging step.

4. A method as recited in claim 1, wherein said solid material comprises a semiconductor material.

5. A method as recited in claim 4, wherein said semiconductor material comprises silicon.

6. A method as recited in claim 1, wherein said atoms comprise hydrogen toms.

7. A method as recited in claim 1, wherein said acceptor centers are formed by introducing a getter material into said solid material.

8. A method as recited in claim 7, wherein said solid material comprises silicon and said getter material is selected from the group consisting of Group III materials.

9. A method as recited in claim 7, wherein said solid material comprises silicon and said getter material is selected from the group consisting of gallium and boron.

10. A method as recited in claim 1, wherein said atoms are transported by rift created by a force field.

11. A method as recited in claim 1, wherein said atoms are transported by drift created by an electric field.

12. A method as recited in claim 1, wherein said atoms are transported by diffusion.

13. A method for transposed splitting of ion cut materials, comprising the steps of:
    (a) introducing a plurality of acceptor centers into a solid material, wherein said acceptor centers form a contour line in said material;
    (b) introducing a plurality of atoms into said material at a location spaced apart from the location of said acceptor centers;
    (c) transporting said atoms toward the location of said acceptor centers; and
    (d) expunging a layer of said material, wherein said expunged layer has a surface with a contour following the contour line of said acceptor centers.

14. A method as recited in claim 13, further comprising the step of attaching said expunged layer to a second solid material.

15. A method as recited in claim 13, wherein said solid material is attached to a second solid material prior to said expunging step.

16. A method as recited in claim 13, wherein said solid material comprises a semiconductor material.

17. A method as recited in claim 16, wherein said semiconductor material comprises silicon.

18. A method as recited in claim 13, wherein said atoms comprise hydrogen atoms.

19. A method as recited in claim 13, wherein said acceptor centers are formed by introducing a getter material into said solid material.

20. A method as recited in claim 19, wherein said solid material comprises silicon and said getter material is selected from the group consisting of Group III materials.

21. A method as recited in claim 19, wherein said solid material comprises silicon and said getter material is selected from the group consisting of gallium and boron.

22. A method as recited in claim 13, wherein said atoms are transported by drift created by a force field.

23. A method as recited in claim 13, wherein said atoms are transported by drift created by an electric field.

24. A method as recited in claim 13, wherein said atoms are transported by diffusion.

25. A method for transposed splitting of ion cut materials, comprising the steps of:

(a) introducing a plurality of acceptor centers into a solid material and forming a contour line in said material defined by said acceptor centers;

(b) introducing a plurality of atoms into said material at a location spaced apart from the contour line of said acceptor centers;

(c) transporting said atoms toward the contour line formed by said acceptor centers; and (d) expunging a layer of said material along a contour line following the contour line of said acceptor centers.

26. A method as recited in claim 25, further comprising the step of attaching said expunged layer to a second solid material.

27. A method as recited in claim 25, wherein said solid material is attached to a second solid material prior to said expunging step.

28. A method as recited in claim 25, wherein said solid material comprises a semiconductor material.

29. A method as recited in claim 28, wherein said semiconductor material comprises silicon.

30. A method as recited in claim 25, wherein said atoms comprise hydrogen atoms.

31. A method as recited in claim 25, wherein said acceptor centers are formed by introducing a getter material into said solid material.

32. A method as recited in claim 31, wherein said solid material comprises silicon and said getter material is selected from the group consisting of Group III materials.

33. A method as recited in claim 31, wherein said solid material comprises silicon and said getter material is selected from the group consisting of gallium and boron.

34. A method as recited in claim 25, wherein said atoms are transported by drift created by a force field.

35. A method as recited in claim 25, wherein said atoms are transported by drift created by an electric field.

36. A method as recited in claim 25, wherein said atoms are transported by diffusion.

* * * * *